(12) United States Patent
Chen et al.

(10) Patent No.: US 10,079,178 B1
(45) Date of Patent: Sep. 18, 2018

(54) FORMATION METHOD OF SEMICONDUCTOR DEVICE STRUCTURE USING MULTILAYER RESIST LAYER

(71) Applicant: Taiwan Semiconductor Manufacturing Co., Ltd., Hsinchu (TW)

(72) Inventors: Po-Ju Chen, Hsinchu (TW); Yi-Wei Chiu, Kaohsiung (TW); Fang-Yi Wu, Kaohsiung (TW); Chih-Hao Chen, Hsinchu (TW); Wen-Yen Chen, Chutung Township, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 8 days.

(21) Appl. No.: 15/461,846

(22) Filed: Mar. 17, 2017

(51) Int. Cl.
| | |
|---|---|
| *H01L 21/768* | (2006.01) |
| *H01L 21/033* | (2006.01) |
| *H01L 21/311* | (2006.01) |
| *H01L 21/027* | (2006.01) |

(52) U.S. Cl.
CPC .... *H01L 21/76879* (2013.01); *H01L 21/0273* (2013.01); *H01L 21/0332* (2013.01); *H01L 21/31111* (2013.01); *H01L 21/31144* (2013.01); *H01L 21/768* (2013.01); *H01L 21/7682* (2013.01); *H01L 21/76802* (2013.01); *H01L 21/76804* (2013.01); *H01L 21/76829* (2013.01); *H01L 21/76831* (2013.01); *H01L 21/76841* (2013.01)

(58) Field of Classification Search
CPC ........................ H01L 21/0273–21/0279; H01L 21/312–21/3128; H01L 21/3144; H01L 21/0332; H01L 21/768; H01L 21/76802; H01L 21/76804; H01L 21/76829; H01L 21/76831; H01L 21/76841
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,159,561 B2 | 10/2015 | Chen et al. |

(Continued)

*Primary Examiner* — Thanhha Pham
(74) *Attorney, Agent, or Firm* — Birch, Stewart, Kolasch & Birch, LLP

(57) ABSTRACT

Formation methods of a semiconductor device structure are provided. The method includes forming a bottom layer, a middle layer and an upper layer over a substrate, developing the upper layer to form an upper pattern with a first opening exposing the middle layer and a sidewall of the upper pattern. The upper pattern has a top surface. The method further includes conformally forming a protective layer over the upper pattern and the exposed middle layer, anisotropically etching the protective layer to leave a portion of the protective layer over the sidewall of the upper pattern and expose the middle layer, etching the middle layer not covered by the upper pattern and the portion of the protective layer to form a middle pattern with a second opening exposing the bottom layer, and etching the bottom layer though the second opening of the middle pattern.

20 Claims, 15 Drawing Sheets

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2016/0056237 A1* | 2/2016 | Mori ................. H01L 29/66659 257/337 |
| 2016/0225639 A1* | 8/2016 | Kihara .............. H01L 21/02208 |

* cited by examiner

FORMATION METHOD OF SEMICONDUCTOR DEVICE STRUCTURE USING MULTILAYER RESIST LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

As lithographic features are reduced, for example to below 40 nanometers (nm), high numerical aperture processes are needed to overcome the resolution limit. The use of a multilayer photoresist film scheme, such as a trilayer photoresist film scheme, appears to be promising in this regard. Specifically, multilayer photoresist films can provide for improvements in line edge roughness (LER) and line width roughness (LWR), among other benefits.

However, using multilayer schemes may pose challenges, especially with the decreasing technology nodes and pitch provided between features. Therefore, it is a challenge to improve the multilayer photoresist film scheme in order to improve the reliability of semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
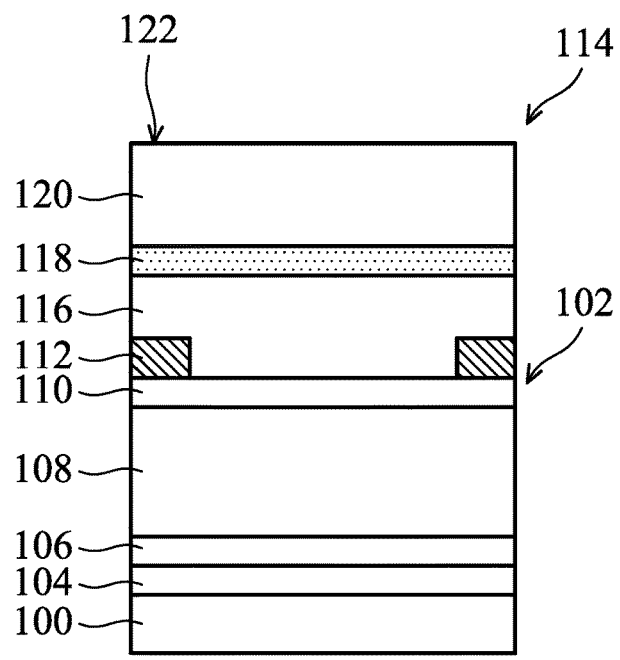
FIGS. 1A-1L are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1A-1L are cross-sectional views of various stages of a process for forming a semiconductor device structure, in accordance with some embodiments. As shown in FIG. 1A, a semiconductor substrate 100 is received or provided, in accordance with some embodiments. In some embodiments, the semiconductor substrate 100 includes a semiconductor substrate. In some embodiments, the semiconductor substrate is a bulk semiconductor substrate, such as a semiconductor wafer. For example, the semiconductor substrate is a silicon wafer. The semiconductor substrate includes silicon or another elementary semiconductor material such as germanium. In some other embodiments, the semiconductor substrate includes a compound semiconductor. The compound semiconductor includes gallium arsenide, silicon carbide, indium arsenide, indium phosphide, another suitable material, or a combination thereof.

In some embodiments, the semiconductor substrate is a semiconductor-on-insulator (SOI) substrate. The SOI substrate may be fabricated by using a separation by implantation of oxygen (SIMOX) process, a wafer bonding process, another applicable method, or a combination thereof.

In some embodiments, parts of or all of the semiconductor substrate 100 in FIG. 1A are fabricated by a semiconductor manufacturing process flow such as a complementary metal-oxide-semiconductor (CMOS) technology process flow, and thus some processes are only briefly described herein. Furthermore, the semiconductor substrate 100 includes various devices and features, such as additional transistors, bipolar junction transistors, resistors, capacitors, diodes, and fuses, but is simplified for a better understanding of the embodiments of the present disclosure.

In some embodiments, the semiconductor substrate 100 in FIG. 1A is an intermediate structure fabricated during manufacturing of an integrated circuit, or a portion thereof. In some embodiments, the integrated circuit includes static random access memory (SRAM) and/or other logic circuits, passive components such as resistors, capacitors, and/or inductors, and active components such as P-channel field effect transistors (PFET), N-channel FET (NFET), metal-oxide semiconductor field effect transistors (MOSFET), complementary metal-oxide semiconductor (CMOS) transistors, bipolar junction transistors (BJT), high voltage transistors, high frequency transistors, diodes, other memory cells, and/or combinations thereof. In some embodiments, the semiconductor substrate 100 includes one or more semiconductor devices (e.g., transistors), which are interconnected.

In some embodiments, various processes are used to form the various device elements mentioned above, including deposition, etching, implantation, photolithography, annealing, and/or other applicable processes.

In some embodiments, the semiconductor substrate is an un-doped substrate. However, in some other embodiments, the semiconductor substrate is a doped substrate such as a P-type substrate or an N-type substrate. In some embodiments, the semiconductor substrate includes various doped regions (not shown) depending on the design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, the semiconductor substrate 100 includes one or more layers and/or features formed on/in the semiconductor substrate. Examples of the layers and/or features include isolation regions such as shallow trench isolation (STI) features, conductive layers, insulating layers, and any other suitable features. In some embodiments, the semiconductor substrate 100 has one layer or multiple layers (conductive layer, insulator layer, and/or interlayer dielectric (ILD) layer) or features (source/drain regions, gate structures, interconnect lines and/or vias), formed on/in the semiconductor substrate.

As shown in FIG. 1A, a material layer 102 is formed over a semiconductor substrate 100, in accordance with some embodiments. As shown in FIG. 1A, the material layer 102 includes an etch stop layer 104 over the semiconductor substrate 100, an oxide layer 106 over the etch stop layer 104, a dielectric layer 108 over the oxide layer 106, and an anti-reflective coating layer 110 over the dielectric layer 108, in accordance with some embodiments.

In some embodiments, the etch stop layer 104 is deposited over the semiconductor substrate 100, as shown in FIG. 1A. In some embodiments, the etch stop layer 104 is made of silicon nitride, silicon oxynitride, silicon carbide, another suitable material, or a combination thereof. In some embodiments, the etch stop layer 104 is formed by chemical vapor deposition, spin-on coating, another applicable process, or a combination thereof. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), another applicable process, or a combination thereof.

Afterward, as shown in FIG. 1A, the oxide layer 106 is deposited over the etch stop layer 104, in accordance with some embodiments. In some embodiments, the oxide layer 106 is made of silicon oxide, silicon oxynitride, another suitable material, or a combination thereof. In some embodiments, the oxide layer 106 is formed by chemical vapor deposition described above, spin-on coating, another applicable process, or a combination thereof.

In some embodiments, the oxide layer 106 is a silicon oxide formed from tetraethyl-ortho-silicate (TEOS) using plasma enhanced chemical vapor deposition. In some embodiments, the oxide layer 106 is a silicon oxide formed from tetraethyl-ortho-silicate (TEOS) and ozone using plasma enhanced chemical vapor deposition.

Afterward, as shown in FIG. 1A, the dielectric layer 108 is deposited over the oxide layer 106, in accordance with some embodiments. In some embodiments, the dielectric layer 108 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a chemical vapor deposition process described above, a spin-on process, a spray coating process, another applicable process, or a combination thereof.

In some embodiments, the dielectric layer 108 is an interlayer dielectric (ILD) layer. In some embodiments, the low-k dielectric layer 108 is a low-k dielectric layer 108. In some embodiments, the low-k dielectric layer 108 includes a low-k dielectric material, which is a material having a dielectric constant less than that of standard silicon dioxide (dielectric constant of silicon oxide is about 3.9). In some embodiments, the low-k dielectric material includes fluorine-doped silicon dioxide, carbon-doped silicon dioxide, porous silicon dioxide, porous carbon-doped silicon dioxide, spin-on organic polymeric dielectric, spin-on silicone based polymeric dielectric, polyimides, aromatic polymers, fluorine-doped amorphous carbon, vapor-deposited parylene, another suitable material, or a combination thereof.

Afterward, as shown in FIG. 1A, the anti-reflective coating layer 110 is deposited over the dielectric layer 108, in accordance with some embodiments. In some embodiments, the anti-reflective coating layer 110 is made of silicon oxycarbide, another suitable material, or a combination thereof. In some embodiments, the anti-reflective coating layer 110 is a nitrogen-free anti-reflective coating (NFARC) layer. In some embodiments, the dielectric material layer is deposited using a chemical vapor deposition process described above, a spin-on process, a spray coating process, another applicable process, or a combination thereof.

However, embodiments of the present disclosure are not limited thereto. For example, the material layer 102 may include more or less layers. In some other embodiments, the material layer 102 includes one or more additional layers positioned between the etch stop layer 104, the oxide layer 106, the dielectric layer 108 and the anti-reflective coating layer 110. In some other embodiments, the material layer 102 includes one or more additional layers positioned over the anti-reflective coating layer 110. In some other embodiments, the material layer 102 includes one or more additional layers positioned under the etch stop layer 104. In some other embodiments, the material layer 102 merely includes the dielectric layer 108. In some other embodiments, the material layer 102 merely includes the etch stop layer 104 and the dielectric layer 108. However, embodiments of the present disclosure are not limited thereto.

Afterward, as shown in FIG. 1A, mask elements 112 are formed over the material layer 102, in accordance with some embodiments. As shown in FIG. 1A, the mask elements 112 partially cover the material layer 102, in accordance with some embodiments.

In some embodiments, the mask elements 112 are made of metal nitride, other suitable materials, or a combination thereof. The metal nitride may include, but is not limited to, titanium nitride, tantalum nitride, other suitable materials, or a combination thereof.

In some embodiments, the mask elements 112 are formed by using an applicable deposition process, an applicable photolithography process and an applicable etching process. The applicable deposition process may include a PVD process, plating process, CVD process, other applicable processes, or a combination thereof.

Afterward, as shown in FIG. 1A, a tri-layer resist layer 114 is formed over the mask elements 112, the anti-reflective coating layer 110 of the material layer 102, in accordance with some embodiments. In some embodiments, the tri-layer resist layer 114 is formed over the semiconductor substrate 100. As shown in FIG. 1A, the tri-layer resist layer 114 includes a bottom layer 116 over the mask elements 112, the anti-reflective coating layer 110 of the material layer 102, and the semiconductor substrate 100, a middle layer 118 over the bottom layer 116 and an upper layer 120 over the middle layer 118, in accordance with some embodiments. As shown in FIG. 1A, the material layer 102 is between the bottom layer 116 and the semiconductor substrate 100, in accordance with some embodiments.

In some embodiments, the bottom layer 116 is an organic layer. In some embodiments, the middle layer 118 is a silicon-containing layer. In some embodiments, the upper layer 120 is an organic layer, such as a photoresist layer. In some embodiments, the material of the upper layer 120 is the same as the material of the bottom layer 116. In some other embodiments, the material of the upper layer 120 is different from the material of the bottom layer 116.

In some embodiments, the bottom layer 116 is a first (e.g., nearest the semiconductor substrate 100) layer of the tri-layer resist layer 114. In some embodiments, the bottom layer 116 is an organic layer and is made of organic material. In some embodiments, the organic material includes monomers or polymers that are not cross-linked. In some embodiments, the bottom layer 116 layer contains a material that is patternable. In some embodiments, the bottom layer 116 layer has a composition tuned to provide anti-reflection properties. In some embodiments, materials of the bottom layer 116 include a carbon backbone polymer.

In some embodiments, the polymer includes various monomers bonded together. In some embodiments, the polymer includes different monomers such as a cross-linking monomer and a monomer with chromophore units. In some embodiments, the monomer with the chromophore unit includes vinyl compounds (e.g., with conjugated double bonds) containing substituted and unsubstituted phenyl, substituted and unsubstituted anthracyl, substituted and unsubstituted phenanthryl, substituted and unsubstituted naphthyl, substituted and unsubstituted acridine, substituted and unsubstituted quinolinyl and ring-substituted quinolinyls (e.g., hydroxyquinolinyl), substituted and unsubstituted heterocyclic rings containing heteroatoms such as oxygen, nitrogen, sulfur, or combinations thereof, such as pyrrolidinyl, pyranyl, piperidinyl, acridinyl, quinolinyl.

The substituents in these units may be any hydrocarbyl group and may further contain heteroatoms, such as, oxygen, nitrogen, sulfur, or combinations thereof, such as alkylenes, esters, ethers, combinations of these, or the like, with between 1 and 12 carbon atoms.

In some embodiments, the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylamino phenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate, combinations of these, or the like.

However, any suitable monomer with chromophore units to absorb the impinging light and reduce or prevent the light from being reflected may alternatively be used, and all such monomers are fully intended to be included within the scope of the embodiments.

In some embodiments, the cross-linking monomer has an acid labile group. In some embodiments, the cross-linking monomer includes a hydrocarbon chain that also includes, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of one (or more) of the following monomers: styrene, hydroxystyrene, hydroxyethyl (meth)acrylate, hydroxypropyl(meth)acrylate, methyl(meth) acrylate, ethyl(meth)acrylate, (meth)acrylic acid, poly (hydroxystyrene-styrene-methacrylate), poly(4-hydroxystyrene), or poly(pyromellitic dianhydride-ethylene glycol-propylene oxide).

In some embodiments, materials of the bottom layer 116 include a carbon backbone polymer. In some embodiments, the carbon backbone polymer has a carbon chain backbone. In some embodiments, the carbon chain backbone is an acrylic, a polyester, an epoxy novalac, a polysaccharide, a polyether, a polyimide, a polyurethane, or a mixture thereof.

In some embodiments, the bottom layer 116 includes photo-acid generator (PAG), thermal-acid generator (TAG), photo-base generator (PBG), thermal-base generator (TBG), and/or quencher. In some embodiments, the bottom layer 116 includes components including groups with a low Ohnishi number, such as aromatic groups.

In some embodiments, the bottom layer 116 includes a solvent. In some embodiments, the solvent includes a ketone-based solvent, ester-based solvent, alcohol-based solvent, amide-based solvent, ether-based solvent, hydrocarbon-based solvent, and/or another suitable solvent, or a combination thereof. In some embodiments, the bottom layer 116 is baked to substantially remove the solvent. In some embodiments, the bottom layer 116 is a wet film before the baking process. In some embodiments, after the baking process, the solvent is substantially removed and the bottom layer 116 becomes a dry film.

In some embodiments, the bottom layer 116 is deposited by a spin coating process. In some other embodiments, the bottom layer 116 is deposited by another applicable deposition process.

As shown in FIG. 1A, the middle layer 118 is deposited over the bottom layer 116, in accordance with some embodiments. In some embodiments, the middle layer 118 includes a silicon-containing layer (e.g., silicon hard mask material). In some embodiments, the middle layer 118 includes a silicon-containing inorganic polymer. In some embodiments, the middle layer 118 includes a siloxane polymer (e.g., a polymer having a backbone of O—Si—O—Si— etc.). The silicon ratio of the middle layer 118 material may be adjusted to control the etch rate. In some other embodiments the middle layer 118 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

In some embodiments, the middle layer 118 includes photo-acid generator (PAG), thermal-acid generator (TAG), photo-base generator (PBG), thermal-base generator (TBG), and/or quencher. In some embodiments, the middle layer 118 includes components including groups with a low Ohnishi number, such as aromatic groups. In some embodiments, the middle layer 118 includes components having a chromophore unit. In some embodiments, the middle layer 118 includes components having a crosslinker unit.

In some embodiments, the middle layer 118 is deposited by a spin coating process. In some other embodiments, the middle layer 118 is deposited by another applicable deposition process.

In some embodiments, the middle layer 118 is thermally baked for cross-linking, and does not contain a solvent. In some embodiments, the middle layer 118 includes a solvent. In some embodiments, the solvent includes a ketone-based solvent, ester-based solvent, alcohol-based solvent, amide-based solvent, ether-based solvent, hydrocarbon-based solvent, and/or another suitable solvent, or a combination thereof. In some embodiments, the middle layer 118 is baked to substantially remove the solvent. In some embodiments, the middle layer 118 is a wet film before the baking process. In some embodiments, after the baking process, the solvent is substantially removed such that the middle layer 118 is turned into a dry film.

As shown in FIG. 1A, the upper layer 120 is deposited over the middle layer 118, in accordance with some embodiments. In some embodiments, the upper layer 120 is a third, and top, layer of the tri-layer resist layer 114. In some embodiments, the upper layer 120 is an organic layer, a photoresist (PR) layer or a photosensitive layer, which is operable to be patterned by radiation. In some embodiments, the material of the upper layer 120 is the same as the material of the bottom layer 116. In some other embodiments, the material of the upper layer 120 is different from the material of the bottom layer 116.

In some embodiments, the chemical properties of the portion of the upper layer 120 struck by incident radiation changes in a manner that depends on the type of photoresist used. In some embodiments, the upper layer 120 is a suitable positive tone resist. Positive tone resist refers to a photoresist material that when exposed to radiation (typically UV light) becomes insoluble to a negative tone developer, while the portion of the photoresist that is not exposed (or exposed less) is soluble in the negative tone developer.

In some embodiments, the term "negative tone developer" refers to any suitable developer that selectively dissolves and removes areas that received no exposure dose or an exposure dose below a predetermined threshold exposure dose value. In some embodiments, the negative tone developer includes an organic solvent. In some embodiments, the organic solvent includes a solvent such as, for example, a ketone-based solvent, ester-based solvent, alcohol-based solvent, amide-based solvent, ether-based solvent, hydrocarbon-based solvent, and/or other suitable solvent.

In some embodiments, the upper layer 120 includes a carbon backbone polymer. In some embodiments, the upper layer 120 includes other suitable components such as a solvent and/or photo acid generators. In some embodiments, the upper layer 120 is a chemical amplified (CA) resist. In some embodiments, the photoresist layer includes a photo-acid generator (PAG) distributed in the photoresist layer. In some embodiments, when absorbing photo energy from an exposure process, the PAG forms a small amount of acid.

In some embodiments, the resist includes a polymer material that varies its solubility to a developer when the polymer is reacted with this generated acid. In some embodiments, the chemical amplified resist is a positive tone resist. Examples of suitable PAGs include salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs.

In some embodiments, the upper layer 120 is deposited by a spin coating process. In some other embodiments, the upper layer 120 is deposited by another applicable deposition process.

In some embodiments, the thicknesses of the bottom layer 116, the middle layer 118 and the upper layer 120 are different from each other. In some embodiments, the thickness of the bottom layer 116 is in a range from about 200 nm to about 400 nm. In some embodiments, the thickness of the middle layer 118 is in a range from about 20 nm to about 40 nm. In some embodiments, the thickness of the upper layer 120 is in a range from about 80 nm to about 200 nm.

In some embodiments, the term "about" means+/−20% of the stated value, more specifically +/−10% of the stated value, more specifically +/−5% of the stated value, more specifically +/−3% of the stated value, more specifically +/−2% of the stated value, more specifically +/−1% of the stated value and even more specifically +/−0.5% of the stated value. The stated value of the present disclosure is an approximate value. When there is no specific description, the stated value includes the meaning of "about".

In some embodiments, the thickness of the bottom layer 116 refers to the distance from the top surface of the material layer 102 to the top surface of the bottom layer 116. In some embodiments, the thickness of the middle layer 118 refers to the distance from the top surface of the bottom layer 116 to the top surface of the middle layer 118. In some embodiments, the thickness of the upper layer 120 refers to the distance from the top surface of the middle layer 118 to the top surface 122 of the upper layer 120.

Figure 1B:
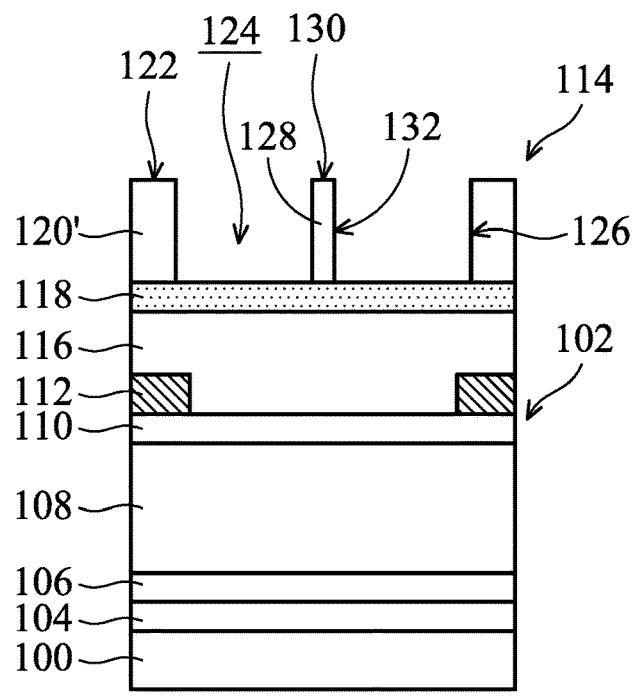

Afterward, as shown in FIG. 1B, the upper layer 120 is developed and patterned to form an upper pattern 120' with one (or more) first opening 124, in accordance with some embodiments. To simplify the diagram, only two first openings 124 are depicted. In some embodiments, the first openings 124 expose portions of the middle layer 118 and sidewalls 126 of the upper pattern 120', in accordance with some embodiments. As shown in FIG. 1B, the upper pattern 120' has a first pattern, in accordance with some embodiments. As shown in FIG. 1B, the upper pattern 120' (or patterned upper layer 120') includes two first openings 124 and a first isolation feature 128 positioned between the two first openings 124, in accordance with some embodiments. As shown in FIG. 1B, the first isolation feature 128 has a top surface 130 and sidewalls 132, in accordance with some embodiments. As shown in FIG. 1B, the top surface 130 of the first isolation feature 128 is a portion of the top surface 122 of the upper pattern 120', in accordance with some embodiments. As shown in FIG. 1B, the sidewalls 132 of the first isolation feature 128 is a portion of the sidewalls 126 of the upper pattern 120', in accordance with some embodiments.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

In some embodiments, one (or more) portion of the upper layer 120 is exposed to a radiation beam. In some embodiments, the radiation beam exposes the upper layer 120 in FIG. 1A over the semiconductor substrate 100 using a lithography system that provides a pattern of the radiation according to an IC design layout. In some embodiments, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, the lithography system includes a charged particle lithography system, such as an electron beam or an ion beam lithography system.

Afterward, the exposed upper layer 120 is developed to form a upper pattern 120'. In some embodiments, a developer is applied to the exposed upper layer 120 to form the upper pattern 120'.

In some embodiments, a negative tone developer is applied to the exposed upper layer 120. The term "negative tone developer" refers to a developer that selectively dissolves and removes areas that received no exposure dose or an exposure dose below a predetermined threshold exposure dose value.

In some embodiments, the developer includes an organic solvent or a mixture of organic solvents, such as methyl a-amyl ketone (MAK) or a mixture involving the MAK. In some other embodiments, a developer includes a water based developer, such as tetramethylammonium hydroxide (TMAH). In some embodiments, applying a developer includes spraying a developer on the exposed resist film, for example by a spin-on process. In some embodiments, the developer removes the non-exposed regions of the resist leaving the portions that have been exposed.

In some embodiments, the upper pattern 120' has a scum (not shown in this figure). In some embodiments, a de-scumming process is performed to remove the scum of the upper pattern 120'. In some embodiments, the de-scumming process includes an etching process. In some embodiments, the etching process is a dry etching process such as an inductively coupled plasma (ICP) process. In some embodiments, an etching gas of the de-scumming process includes Ar and $CF_4$. In some other embodiments, the de-scumming process is not performed.

Figure 1C:
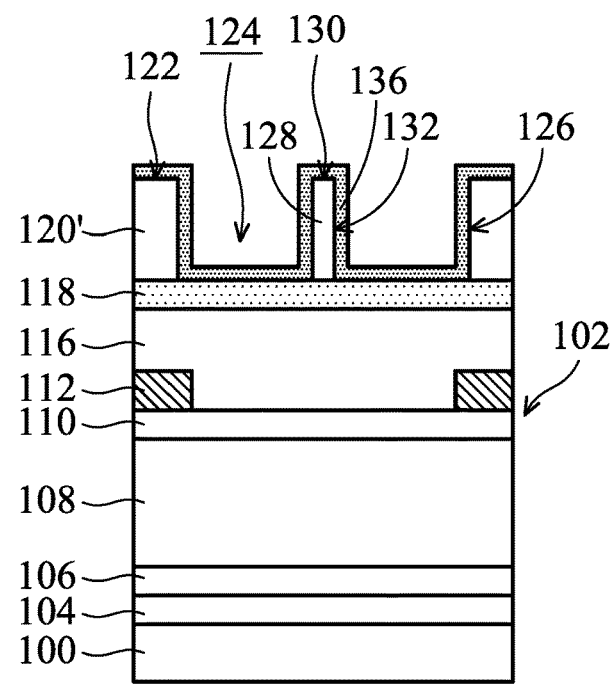

Afterward, as shown in FIG. 1C, a protective layer 136 is formed to conformally cover the tri-layer resist layer 114, in accordance with some embodiments. As shown in FIG. 1C, the protective layer 136 conformally covers the top surface 122 of the upper pattern 120', the sidewall 126 of the upper pattern 120', and the portions of the middle layer 118 exposed by the first openings 124, in accordance with some embodiments. As shown in FIG. 1C, after the protective layer 136 is deposited, the portions of the middle layer 118 exposed by the first openings 124 are covered by the protective layer 136, in accordance with some embodiments.

As shown in FIG. 1C, a portion of the protective layer 136 conformally covers the top surface 130 and the sidewall 132 of the first isolation feature 128, in accordance with some embodiments. As shown in FIG. 1C, some other portions of the protective layer 136 are in the first openings 124 and cover the portions of the middle layer 118 exposed by the first openings 124.

In some embodiments, the protective layer 136 is made of polymer material, dielectric material, another suitable material, or a combination thereof. In some embodiments, the polymer material is formed by applying a precursor gas to the tri-layer resist layer 114. In some embodiments, the precursor gas includes $C_xH_yF_z$. In some embodiments, x is an integer in a range from 1 to 30, for example, 5 to 20. In some embodiments, y is an integer in a range from 0 to 62, for example, 12 to 42. In some embodiments, z is an integer in a range from 0 to 62, for example, 1 to 50, or 12 to 42. In some embodiments, when z is an integer greater than 0, the polymer material formed from the precursor gas is a fluorine-containing polymer. In some embodiments, the dielectric material includes silicon oxide, silicon oxycarbide, silicon oxynitride, silicon nitride, another suitable material, or a combination thereof. In some embodiments, the dielectric material is formed by chemical vapor deposition, spin-on coating, another applicable process, or a combination thereof. The chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, another applicable process, or a combination thereof.

Figure 1D:
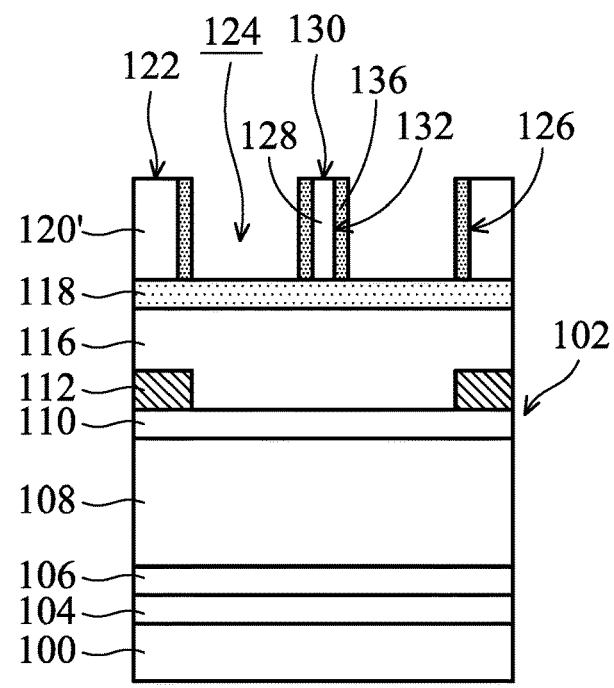

Afterward, as shown in FIG. 1D, portions of the protective layer 136 over the middle layer 118 are removed, in accordance with some embodiments. As shown in FIG. 1D, the portions of the protective layer 136 which are in direct contact with the middle layer 118 are removed, in accordance with some embodiments. As shown in FIG. 1D, after the portions of the protective layer 136 are removed, the portions of the middle layer 118 are exposed by the two first openings 124 again, in accordance with some embodiments.

In some embodiments, an etching process is applied to remove material of the protective layer 136 over the middle layer 118. In some embodiments, the etch process is a dry etching process using etchant(s) including $CF_4$, $C_3F_8$, $C_4F_8$, $CHF_3$, and/or $CH_2F_2$. In some embodiments, the etching process is a reactive ion etching process, a plasma etching process, any other applicable etching process, or a combination thereof.

As shown in FIG. 1D, during the removal of the portion of the protective layer 136 which is over the middle layer 118, portions of the protective layer 136 over the top surface 122 of the upper pattern 120' is also removed, in accordance with some embodiments. As shown in FIG. 1D, during the removal of the portion of the protective layer 136 which is over the middle layer 118, portions of the protective layer 136 over the sidewall 126 of the upper pattern 120' remain, in accordance with some embodiments. In some embodiments, the portions of the protective layer 136 over the sidewall 132 of the first isolation feature 128 remain, in accordance with some embodiments. In some embodiments, since the portions of the protective layer 136 over the sidewall 132 of the first isolation feature 128 remain, the first isolation feature 128 and the subsequently formed isolation feature under the first isolation feature 128 are protected by the protective layer 136 during the subsequent processes. In other words, In some embodiments of the present disclosure, the protective layer 136 is anisotropically etched to leave a portion of the protective layer 136 over the sidewall 126 of the upper pattern 120' and expose the middle layer 118. In some embodiments of the present disclosure, after anisotropically etching the protective layer 136, the top surface 122 of the upper pattern 120' is exposed.

Figure 1E:
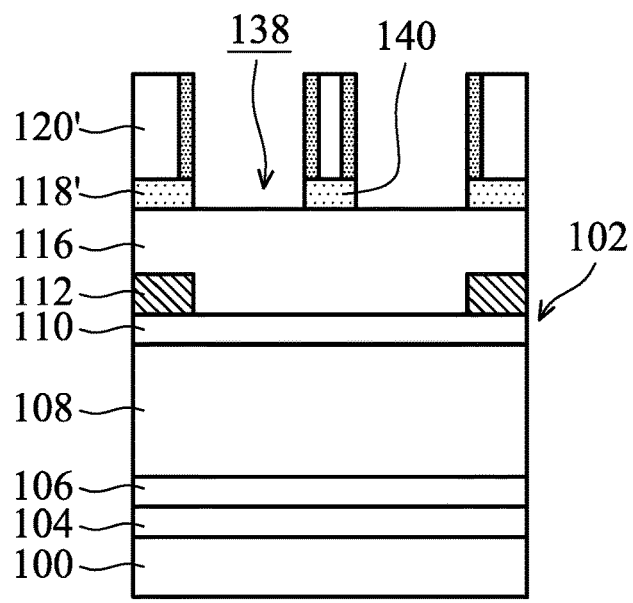

Afterward, as shown in FIG. 1E, by using the upper pattern 120' and the remaining portion of the protective layer 136 as a mask, the portion of the middle layer 118 not covered by the upper pattern 120' and the remaining portion of the protective layer 136 are etched to form a middle pattern 118' with two second openings 138 exposing portions of the bottom layer 116, in accordance with some embodiments. As shown in FIG. 1E, the two second openings 138 are aligned with the two first openings 124, in accordance with some embodiments. In some embodiments, the middle pattern 118' has a second pattern. In some embodiments, the upper pattern 120' with the first opening 124 has the first pattern, and this first pattern is transferred to the middle pattern 118' through the etching process. Therefore, in some embodiments, after the etching process, the middle pattern 118' with the second opening 138 has a second pattern, and the second pattern is the same as the first pattern.

In some embodiments, an etching process is applied to remove material of the middle layer 118 not covered by the upper pattern 120' and the remaining portion of the protective layer 136. In some embodiments, the etch process is a dry etching process using etchant(s) including $CF_4$, $C_3F_8$, $C_4F_8$, $CHF_3$, and/or $CH_2F_2$. In some embodiments, the etching process is a reactive ion etching process, a plasma etching process, any other applicable etching process, or a combination thereof.

In some embodiments, the removal of the portions of the protective layer 136 which are over the middle layer 118 and the etching of the portions of the middle layer 118 not covered by the upper pattern 120' and the remaining portion of the protective layer 136 are performed by a single etching process. However, in some other embodiments, the removal of the portions of the protective layer 136 which are over the middle layer 118 and the etching of the portions of the middle layer 118 not covered by the upper pattern 120' and the remaining portion of the protective layer 136 are performed by different etching processes.

As shown in FIG. 1E, the middle pattern 118' includes a second isolation feature 140 positioned between the two second openings 138 and aligned with the first isolation feature 128, in accordance with some embodiments.

Figure 1F:
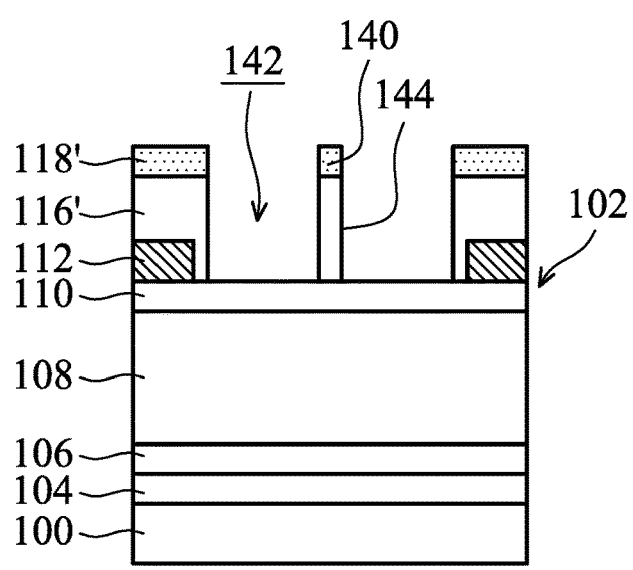

Afterward, as shown in FIG. 1F, by using the middle pattern 118' having the second opening 138 as a mask, the portions of the bottom layer 116 exposed by the two second openings 138 of the middle pattern 118' are etched to form a bottom pattern 116' with two third openings 142 exposing portions of the material layer 102, in accordance with some embodiments. In some embodiments of the present disclosure, the bottom layer 116 is etched through the second opening 138. In some embodiments, the two third openings 142 are aligned with the two second openings 138. In some embodiments, the etched bottom pattern 116' has a third pattern. In some embodiments, the middle pattern 118' with the second openings 138 has the second pattern, and this second pattern is transferred to the bottom pattern 116' through the etching process. Therefore, in some embodiments, after the etching process, the bottom pattern 116' with the third openings 142 has a third pattern, and the third pattern is the same as the second pattern of the middle layer 118.

In some embodiments, an etching process is applied to remove material of the bottom layer 116 exposed by the second opening 138 of the middle layer 118. In some embodiments, the etching process uses a dry etch process. In some embodiments, the dry etch process uses oxygen plasma, carbon dioxide plasma, another suitable plasma, or a combination thereof. In some embodiments, the etching process is a reactive ion etching process, a plasma etching process, any other applicable etching process, or a combination thereof.

As shown in FIG. 1F, the bottom pattern 116' includes a third isolation feature 144 positioned between the two third openings 142 and aligned with the second isolation feature 140, in accordance with some embodiments.

As shown in FIG. 1F, during the etching process which etches the portions of the bottom layer 116 exposed by the second openings 138 of the middle pattern 118', the upper pattern 120' and portions of the protective layer 136 over the sidewall 126 of the upper pattern 120' are also removed, in accordance with some embodiments.

In some embodiments, since the first isolation feature 128 is protected by the protective layer 136, the first isolation feature 128 is removed slowly during the etching process which etches the portions of the bottom layer 116 exposed by the second openings 138. Therefore, in some embodiments, the second isolation feature 140 remains after the etching process which etches the portions of the bottom layer 116 exposed by the second openings 138, as shown in FIG. 1F. Therefore, the bottom pattern 116' and the subsequently formed openings and vias in the material layer 102 may preserve the designed pattern.

In some cases, the protective layer is not formed, and the first isolation feature is not protected by the protective layer. In these cases, the first isolation feature would be removed too quickly during the etching process which etches the bottom layer. In these cases, the second isolation feature may be exposed for a long time in the etching process which etches the bottom layer and may also be removed. This may decrease the structural reliability of the pattern of the bottom layer and the subsequently formed vias. In these cases, even the third isolation feature may be removed during the etching process which etches the bottom layer. In these cases, the bottom pattern (or named etched bottom layer) and the subsequently formed openings and vias in the material layer may have the wrong pattern.

Figure 1G:
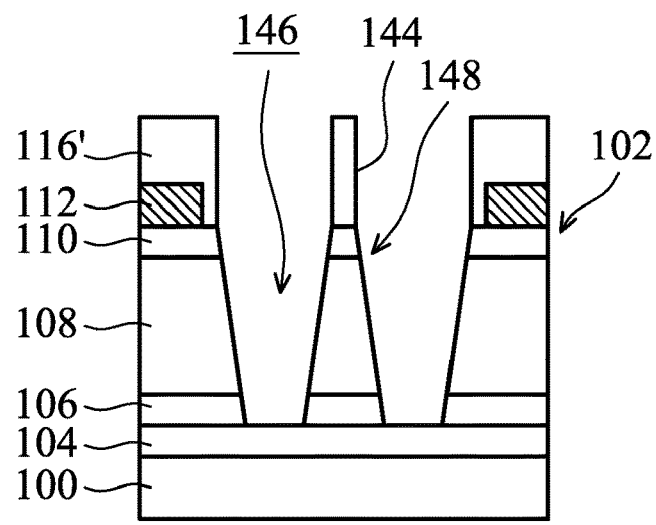

Afterward, as shown in FIG. 1G, the formed two third openings 142 expose the portions of the material layer 102, in accordance with some embodiments. As shown in FIG. 1G, by using the bottom pattern 116' as a mask, the portions of the material layer 102 exposed by the two third openings 142 of the bottom pattern 116' are etched to form two fourth openings 146 aligned with the two third openings 142, in accordance with some embodiments. In some embodiments of the present disclosure, the material layer 102 is etched through the two third openings 142. As shown in FIG. 1G, the fourth openings 146 expose portions of the etch stop layer 104, in accordance with some embodiments. As shown in FIG. 1G, the anti-reflective coating layer 110, the dielectric layer 108, and the oxide layer 106 are sequentially etched to form the fourth openings 146, in accordance with some embodiments.

In some embodiments, an etching process is applied to remove material of the material layer 102 exposed by the third opening 142 of the upper pattern 120'. In some embodiments, the etching process may include a wet etching process, a dry etching process, or a combination thereof.

As shown in FIG. 1G, the etched material layer 102 includes a fourth isolation feature 148 positioned between the two fourth openings 146 and aligned with the third isolation feature 144, in accordance with some embodiments. As shown in FIG. 1G, the fourth isolation feature 148 includes the portion of the oxide layer 106 between the two fourth openings 146, the portion of the dielectric layer 108 between the two fourth openings 146, and the portion of the anti-reflective coating layer 110 between the two fourth openings 146.

However, embodiments of the present disclosure are not limited thereto. In some other embodiments, the material layer 102 merely includes the etch stop layer 104 and the dielectric layer 108, and the fourth isolation feature 148 merely includes the portion of the dielectric layer 108 between the two fourth openings 146. In some other embodiments, the fourth isolation feature 148 merely includes the portion of the oxide layer 106 between the two fourth openings 146, and the portion of the dielectric layer 108 between the two fourth openings 146. In some other embodiments, the fourth isolation feature 148 merely includes the portion of the dielectric layer 108 between the two fourth openings 146, and the portion of the anti-reflective coating layer 110 between the two fourth openings 146. However, embodiments of the present disclosure are not limited thereto.

In some embodiments, since the first isolation feature 128 is protected by the protective layer 136, the first isolation feature 128 is removed slowly during the etching process which etches the bottom layer 116. Therefore, as shown in FIG. 1F, in some embodiments, the second isolation feature 140 remains over the third isolation feature 144 after the etching process which etches the bottom layer 116. In some embodiments, the remaining second isolation feature 140 may protect the third isolation feature 144 in the subsequent processes. Therefore, as shown in FIG. 1G, due to the protection of the second isolation feature 140, the third isolation feature 144 of the bottom pattern 116' may remain over the fourth isolation feature 148 of the material layer 102 after the etching process which etches the material layer 102, in accordance with some embodiments. Therefore, the etched material layer 102 and the subsequently formed vias in the material layer 102 may preserve the designed pattern.

In some cases, the protective layer is not formed, and the first isolation feature is not protected by the protective layer. In these cases, the first isolation feature would be removed too quickly during the etching process shown in FIG. 1F. In these cases, the second isolation feature may be exposed for a long time in the etching process and may also be removed in the etching process shown in FIG. 1F. In these cases, since the third isolation feature is not protected by the second isolation feature, the third isolation feature may also be removed in the etching process shown in FIG. 1F or FIG. 1G. Accordingly, the fourth isolation feature is not protected by the third isolation feature, and the fourth isolation feature may be over-etched during the etching process shown in FIG. 1G. Therefore, the etched material layer may have the wrong pattern. In these cases, the subsequently formed vias in the material layer may have the wrong pattern too.

Figure 1H:
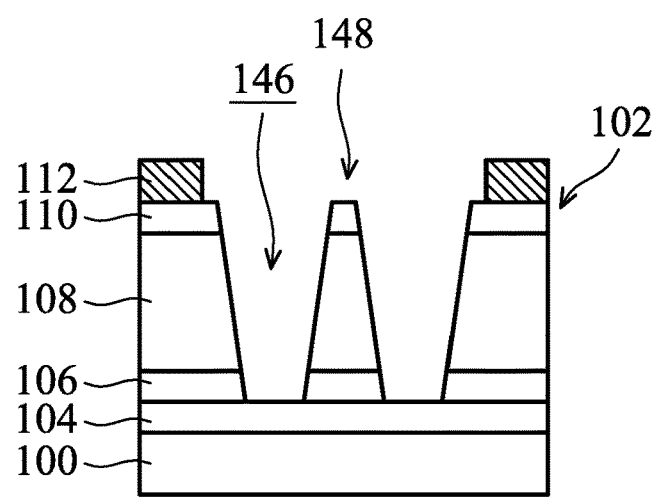

Afterward, as shown in FIG. 1H, the bottom pattern 116' is removed. In some embodiments, the bottom pattern 116' is removed by using an ashing process or stripping process. In some embodiments, the ashing process uses oxygen plasma, carbon dioxide plasma, another suitable plasma, or a combination thereof.

Figure 1I:
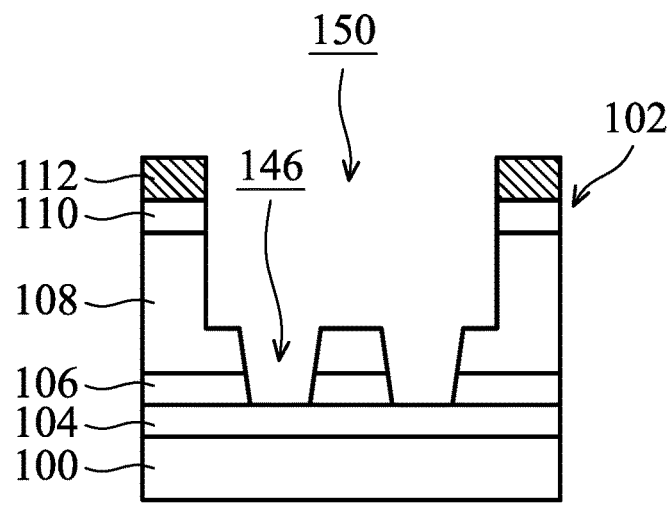

Afterward, as shown in FIG. 1I, by using the mask elements 112 as a mask, portions of the anti-reflective coating layer 110 and the dielectric layer 108 are etched to form a trench 150. In some embodiments, the etching process may include a wet etching process, a dry etching process, or a combination thereof.

Figure 1J:
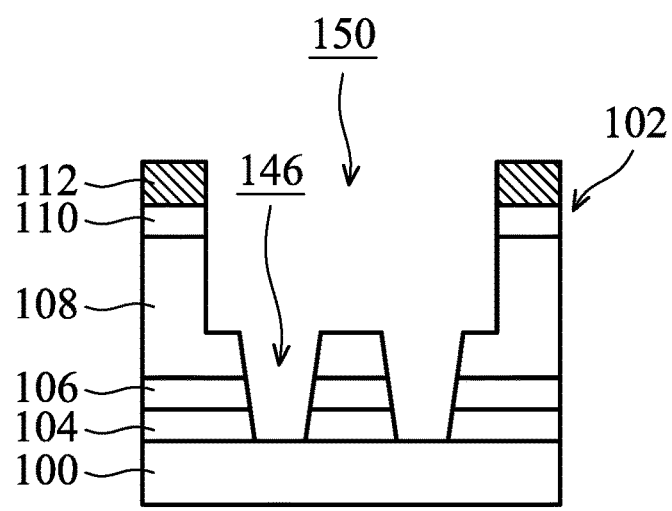

Afterward, as shown in FIG. 1J, the portions of the etch stop layer 104 exposed by the fourth openings 146 are etched to expose the semiconductor substrate 100, in accordance with some embodiments. As shown in FIG. 1J, after the etching process which etches the etch stop layer 104, the fourth openings 146 extend through the etch stop layer 104 and expose the semiconductor substrate 100, in accordance with some embodiments. In some embodiments, the etching process may include a wet etching process, a dry etching process, or a combination thereof.

Figure 1K:
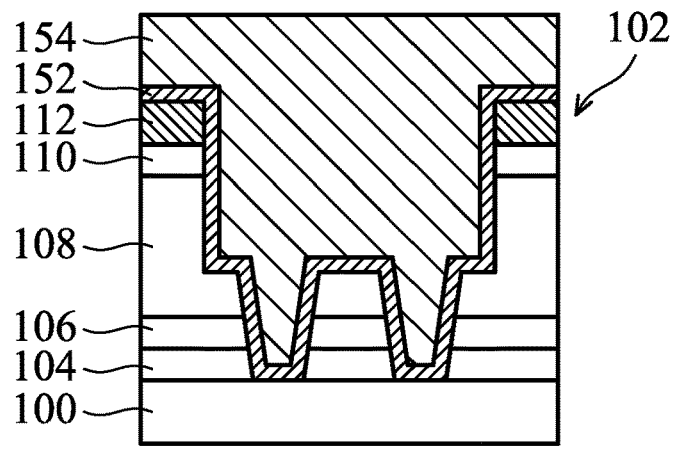

Afterward, as shown in FIG. 1K, a barrier layer 152 is deposited over the trench 150 and the fourth openings 146, in accordance with some embodiments. As shown in FIG. 1K, the barrier layer 152 conformally covers the top surface of the material layer 102, the sidewalls of the material layer 102 exposed by the trench 150 and the fourth openings 146, and the portions of the semiconductor substrate 100 exposed by the fourth openings 146, in accordance with some embodiments.

In some embodiments, the barrier layer 152 is made of a metal nitride such as TaN, TiN, WN, TbN, VN, ZrN, CrN, WC, WN, WCN, NbN, AlN, and combinations thereof. In some embodiments, the barrier layer 152 includes a Ta/TaN bi-layer structure. In some embodiments, the barrier layer 152 is deposited by using physical vapor deposition (PVD), chemical vapor deposition (CVD), plasma enhanced chemical vapor deposition (PECVD), or plasma enhanced atomic layer deposition (PEALD), other applicable processes, or a combination thereof.

Afterwards, as shown in FIG. 1K, a metal material layer 154 is deposited over the barrier layer 152 and the material layer 102, in accordance with some embodiments. As shown in FIG. 1K, the metal material layer 154 fills into the trench 150 and the fourth openings 146, in accordance with some embodiments. In some embodiments, the metal material layer 154 is made of tungsten, copper, aluminum, titanium, cobalt, tantalum, gold, chromium, nickel, platinum, iridium, rhodium, an alloy thereof, another conductive material, or a combination thereof. In some embodiments, the metal material layer 154 is deposited by using an applicable deposition process. The applicable deposition process may include a PVD process, plating process, CVD process, other applicable processes, or a combination thereof.

As shown in FIG. 1K, the barrier layer 152 is positioned between the metal material layer 154 and the material layer 102, the semiconductor substrate 100 so as to prevent metal diffusion from the metal material layer 154 into the material layer 102 and the semiconductor substrate 100, in accordance with some embodiments.

Figure 1L:
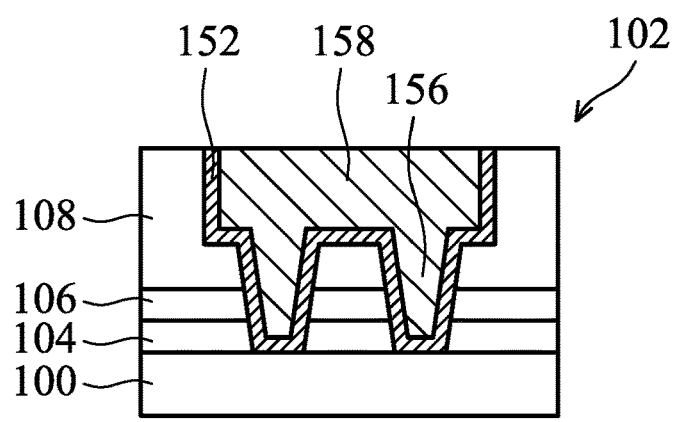

Afterward, as shown in FIG. 1L, a planarization process is performed to thin down the metal material layer 154 to form a semiconductor device structure 1000, in accordance with some embodiments. For example, the metal material layer 154 is thinned until the dielectric layer 108 is exposed. The planarization process may include a chemical mechanical polishing (CMP) process, a grinding process, a dry polishing process, an etching process, another applicable process, or a combination thereof.

As shown in FIG. 1L, the mask elements 112 and the anti-reflective coating layer 110 are also removed during the planarization process, in accordance with some embodiments. As shown in FIG. 1L, a portion of the barrier layer 152 over the mask elements 112 and the anti-reflective coating layer 110 are also removed during the planarization process, in accordance with some embodiments.

As shown in FIG. 1L, the portion of the metal material layer 154 that remains in the two fourth openings 146 forms two conductive vias 156 in the material layer 102, in accordance with some embodiments. As shown in FIG. 1L, the portion of the metal material layer 154 that remains in the trench 150 forms an interconnect line 158, in accordance with some embodiments. As shown in FIG. 1L, the conductive via 156 is in direct contact with the semiconductor substrate 100, in accordance with some embodiments.

However, embodiments of the present disclosure are not limited thereto. In some other embodiments, the conductive via 156 is electrically connected to another conductive via in another interlayer dielectric (ILD) layer under the material layer 102. This will be described in more detail in the following description in FIG. 3A.

FIGS. 2A-2D are cross-sectional views of various stages of a process for forming a semiconductor device structure 2000, in accordance with some other embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

Figure 2A:
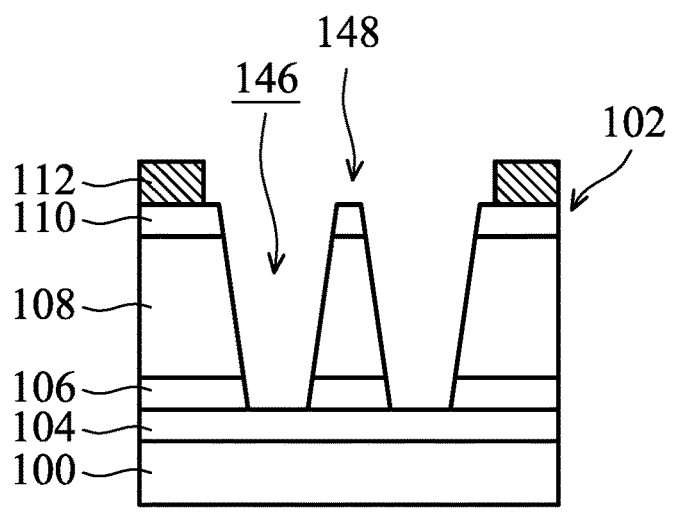
FIGS. 2A-2D are cross-sectional views of various stages of a process for forming a semiconductor device structure, in accordance with some other embodiments.
Figure 2B:
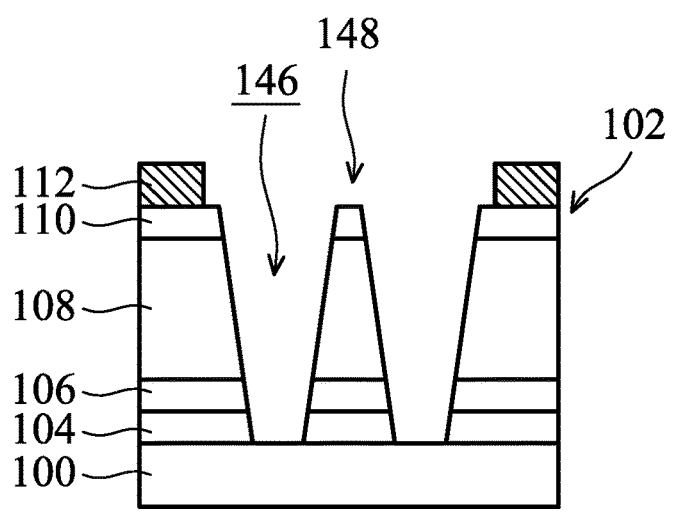

As shown in FIG. 2A, a structure the same as that shown in FIG. 1H is provided or received, in accordance with some embodiments. Afterward, as shown in FIG. 2B, the portions of the etch stop layer 104 exposed by the fourth openings 146 are etched to expose the semiconductor substrate 100, in accordance with some embodiments. As shown in FIG. 2B, after the etching process which etches the etch stop layer 104, the fourth openings 146 extend through the etch stop layer 104 and expose the semiconductor substrate 100, in accordance with some embodiments. In some embodiments, the etching process may include a wet etching process, a dry etching process, or a combination thereof.

Figure 2C:
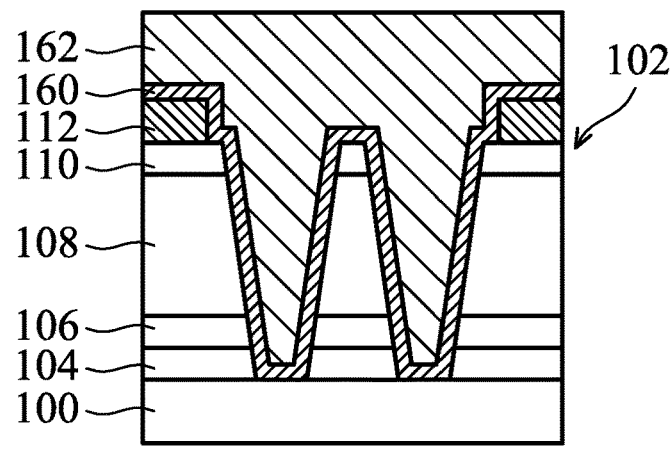

Afterward, as shown in FIG. 2C, a barrier layer 160 is deposited over the trench 150 and the fourth openings 146, in accordance with some embodiments. As shown in FIG. 2C, the barrier layer 160 conformally covers the top surface of the material layer 102, the sidewalls of the material layer 102 exposed by the fourth openings 146, and the portions of the semiconductor substrate 100 exposed by the fourth openings 146, in accordance with some embodiments.

In some embodiments, the material and the formation method of the barrier layer 160 is the same or similar to the barrier layer 152. This will be described in more detail in the following description.

Afterwards, as shown in FIG. 2C, a metal material layer 162 is deposited over the barrier layer 160 and the material layer 102, in accordance with some embodiments. As shown in FIG. 2C, the metal material layer 162 fills into the fourth openings 146, in accordance with some embodiments. In some embodiments, the material and the formation method of the metal material layer 162 is the same or similar to the metal material layer 154. This will be described in more detail in the following description.

Figure 2D:
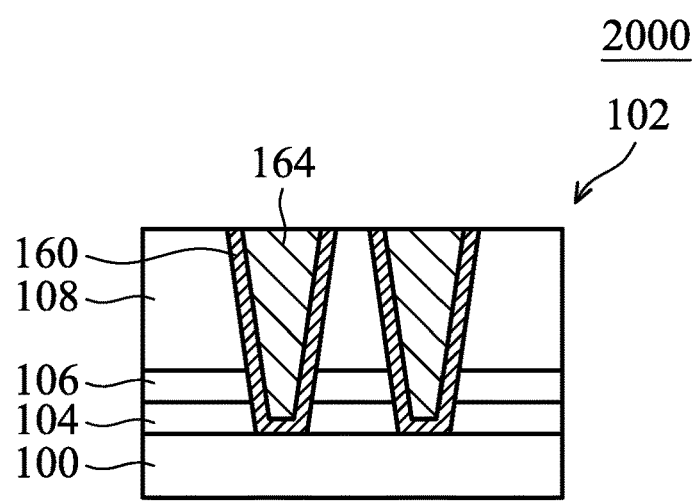

Afterward, as shown in FIG. 2D, a planarization process is performed to thin down the metal material layer 162 to form a semiconductor device structure 2000, in accordance with some embodiments. For example, the metal material layer 162 is thinned until the dielectric layer 108 is exposed.

As shown in FIG. 2D, the portion of the metal material layer 162 that remains in the two fourth openings 146 forms two conductive vias 164 in the material layer 102, in accordance with some embodiments. As shown in FIG. 2D, the trench and the interconnect line are not formed, in accordance with some embodiments.

As shown in FIG. 2D, the conductive via 156 is in direct contact with the semiconductor substrate 100, in accordance with some embodiments. However, embodiments of the present disclosure are not limited thereto. In some other embodiments, the conductive via 156 is electrically connected to another conductive via in another interlayer dielectric (ILD) layer under the material layer 102. This will be described in more detail in the following description in FIG. 3B.

Figure 3A:
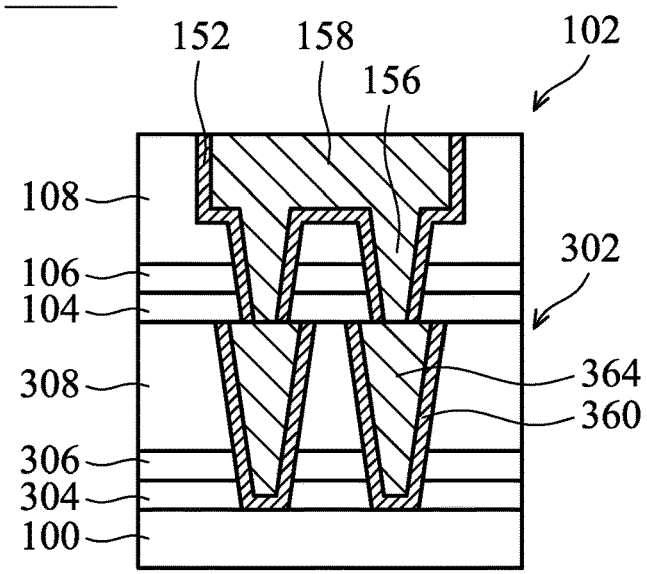
FIG. 3A is a cross-sectional view of a semiconductor device structure in accordance with some other embodiments of the present disclosure.

FIG. 3A is a cross-sectional view of a semiconductor device structure 3000A in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity. As shown in FIG. 3A, a material layer 302 is formed over a semiconductor substrate 100, in accordance with some embodiments.

As shown in FIG. 3A, the material layer 302 includes an etch stop layer 304 over the semiconductor substrate 100, an oxide layer 306 over the etch stop layer 304, and a dielectric layer 308 over the oxide layer 306, in accordance with some embodiments. As shown in FIG. 3A, the semiconductor device structure 3000A further includes two conductive vias 364 formed in the material layer 102, in accordance with some embodiments. As shown in FIG. 3A, the semiconductor device structure 3000A further includes a barrier layer 360 between the two conductive vias 364 and the material layer 302, the semiconductor substrate 100, in accordance with some embodiments.

In some embodiments, the material and the formation method of the etch stop layer 304 is the same or similar to the etch stop layer 104. In some embodiments, the material and the formation method of the oxide layer 306 is the same or similar to the oxide layer 106.

In some embodiments, the material and the formation method of the dielectric layer 308 is the same or similar to the dielectric layer 108. In some embodiments, the material and the formation method of the barrier layer 360 is the same or similar to the barrier layer 160. In some embodiments, the material and the formation method of the conductive vias 364 is the same or similar to the conductive vias 164. In some embodiments, the etch stop layer 304, the oxide layer 306, the dielectric layer 308, the barrier layer 360 and the conductive vias 364 are formed by the process described in FIGS. 2A-2D or any other applicable process. These will not be repeated for the sake of brevity.

As shown in FIG. 3A, the material layer 102 and the conductive vias 156 are positioned over the material layer 302 and the conductive vias 364, in accordance with some embodiments. As shown in FIG. 3A, the conductive via 156 is electrically connected to the conductive via 364 formed in the dielectric layer 308 under the material layer 102, in accordance with some embodiments.

In some embodiments, the bottom portion of the barrier layer 152 is removed to expose the conductive vias 364 before the deposition of the metal material layer 154 which is used to form the conductive via 156. As shown in FIG. 3A, the conductive via 156 is in direct contact with the conductive vias 364, in accordance with some embodiments.

Figure 3B:
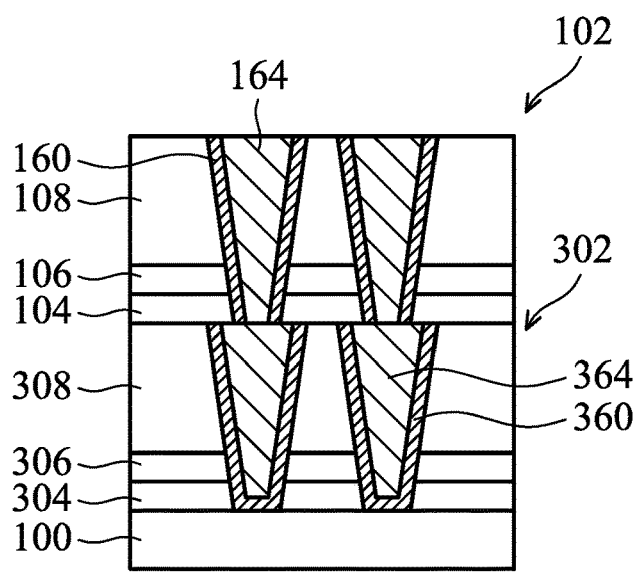
FIG. 3B is a cross-sectional view of a semiconductor device structure in accordance with some other embodiments of the present disclosure.

FIG. 3B is a cross-sectional view of a semiconductor device structure 3000B in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity. As shown in FIG. 3B, the conductive via 164 is electrically connected to the conductive via 364 formed in the dielectric layer 308 under the material layer 102, in accordance with some embodiments.

In some embodiments, the bottom portion of the barrier layer 160 is removed to expose the conductive vias 364 before the deposition of the metal material layer 162 which is used to form the conductive via 164. As shown in FIG. 3A, the conductive via 164 is in direct contact with the conductive vias 364, in accordance with some embodiments.

Figure 4A:
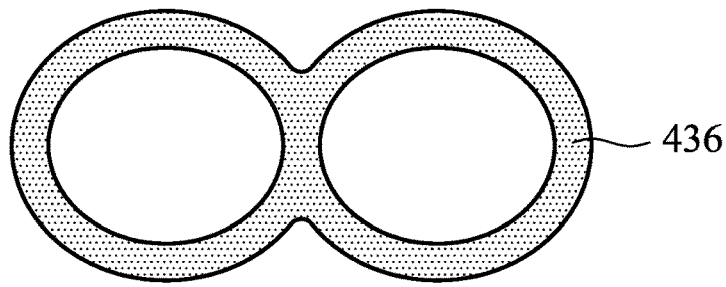
FIG. 4A-4D are top views of protective layers in accordance with some embodiments of the present disclosure.

FIG. 4A is a top view of a protective layer 436 in accordance with some embodiments of the present disclosure. FIG. 4E is a top view of conductive vias 464 in accordance with some embodiments of the present disclosure. In some embodiments, the protective layer 436 is the remaining portion of the protective layer over the sidewall of the upper layer as shown in FIG. 1D. In some embodiments, the conductive vias 464 in FIG. 4E are conductive vias formed in a manufacturing process using the protective layer 436 shown in FIG. 4A. In some embodiments, the conductive vias 464 are the conductive vias 156 shown in FIG. 1L. In some embodiments, the conductive vias 464 are the conductive vias 164 shown in FIG. 2D.

As shown in FIG. 4E, the conductive vias 464 has a circular top view, in accordance with some embodiments. As shown in FIG. 4A, when viewed from a top view, the protective layer 436 is positioned along the periphery of the two conductive vias 464, in accordance with some embodiments. As shown in FIG. 4A, when viewed from a top view, the protective layer 436 has a shape that encloses the conductive vias 464, in accordance with some embodiments.

Figure 4B:
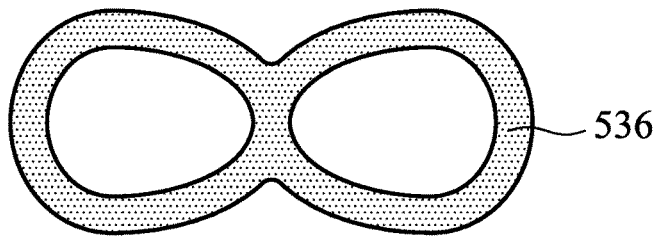

FIG. 4B is a top view of a protective layer 536 in accordance with some other embodiments of the present disclosure. FIG. 4F is a top view of conductive vias 564 formed in a manufacturing process using the protective layer 536 shown in FIG. 4B. As shown in FIG. 4F, the conductive vias 564 has a drop-shaped top view, in accordance with some embodiments. As shown in FIG. 4B, when viewed from a top view, the protective layer 536 is positioned along the periphery of the two conductive vias 564, in accordance with some embodiments. As shown in FIG. 4B, when viewed from a top view, the protective layer 536 has a shape that encloses the conductive vias 564, in accordance with some embodiments.

Figure 4C:
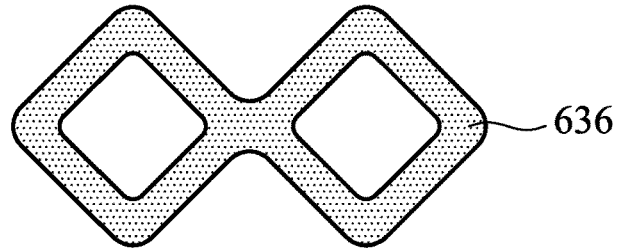

FIG. 4C is a top view of a protective layer 636 in accordance with some other embodiments of the present disclosure. FIG. 4G is a top view of conductive vias 664 formed in a manufacturing process using the protective layer 636 shown in FIG. 4C. As shown in FIG. 4G, the conductive vias 664 has a square top view, in accordance with some embodiments. As shown in FIG. 4C, when viewed from a top view, the protective layer 636 is positioned along the periphery of the two conductive vias 664, in accordance with some embodiments. As shown in FIG. 4C, when viewed from a top view, the protective layer 636 has a shape that encloses the conductive vias 664, in accordance with some embodiments.

Figure 4D:
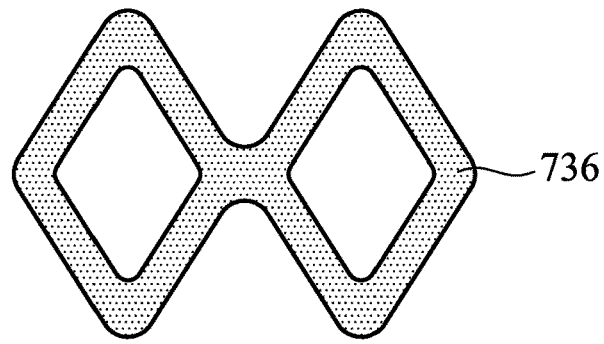
Figure 4E:
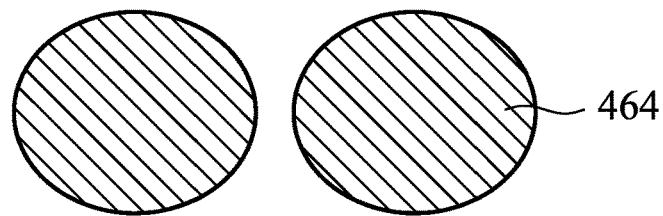
FIG. 4E-4H are top views of vias in accordance with some embodiments of the present disclosure.
Figure 4F:
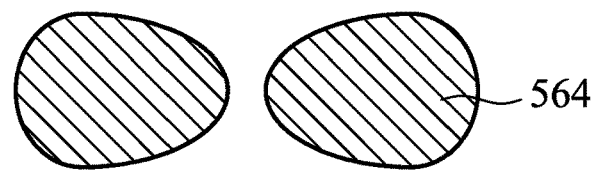
Figure 4G:
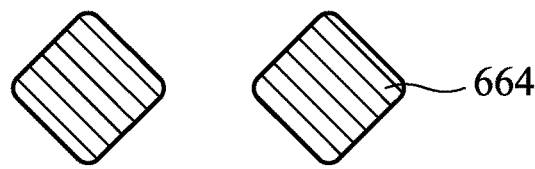
Figure 4H:
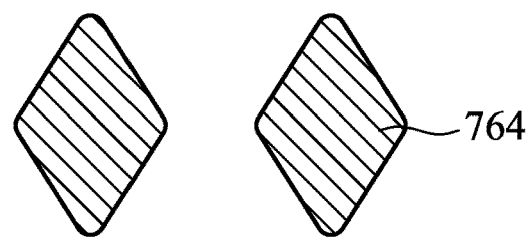

FIG. 4D is a top view of a protective layer 736 in accordance with some other embodiments of the present disclosure. FIG. 4H is a top view of conductive vias 764 formed in a manufacturing process using the protective layer 736 shown in FIG. 4D. As shown in FIG. 4H, the conductive vias 764 has a rhombus top view, in accordance with some embodiments. As shown in FIG. 4D, when viewed from a top view, the protective layer 736 is positioned along the periphery of the two conductive vias 764, in accordance with some embodiments. As shown in FIG. 4D, when viewed from a top view, the protective layer 736 has a shape that encloses the conductive vias 764, in accordance with some embodiments.

Figure 5A:
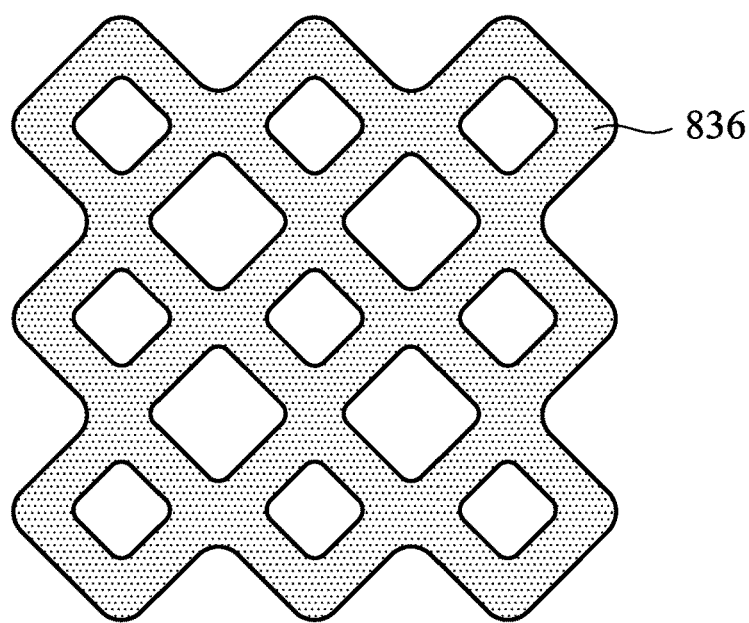
FIG. 5A is a top view of a protective layer in accordance with some other embodiments of the present disclosure.
Figure 5B:
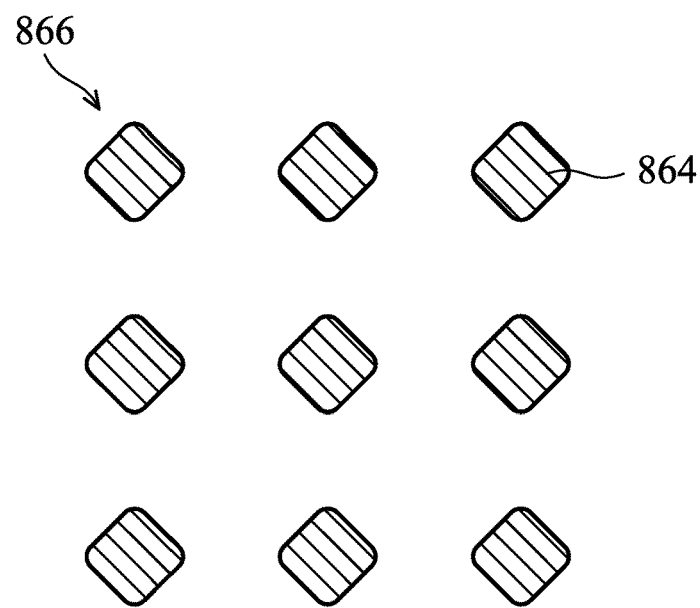
FIG. 5B is a top view of vias in accordance with some other embodiments of the present disclosure.

FIG. 5A is a top view of a protective layer 836 in accordance with some other embodiments of the present disclosure. FIG. 5B is a top view of a via array 866 including two or more conductive vias 864 formed in a manufacturing process using the protective layer 836 shown in FIG. 5A. As shown in FIG. 5B, the via array 866 includes nine conductive vias 864, and the conductive vias 864 have a square top view, in accordance with some embodiments. As shown in FIG. 5A, when viewed from a top view, the protective layer 836 is positioned along the periphery of the conductive vias 864, in accordance with some embodiments. As shown in FIG. 5A, when viewed from a top view, the protective layer 836 has a shape that encloses the conductive vias 864, in accordance with some embodiments. In some embodiments of the present disclosure, the via array 866 is positioned in the pad via area of the semiconductor device structure.

Figure 6A:
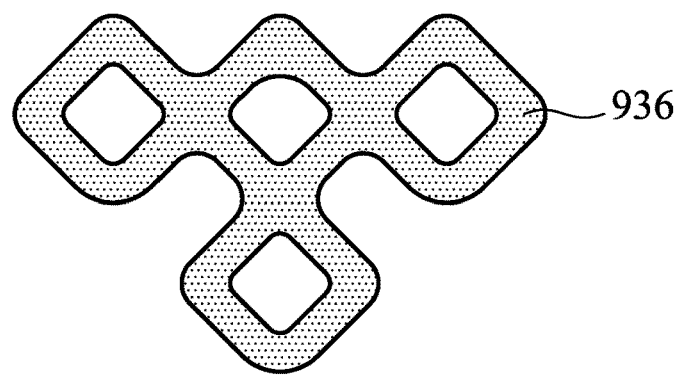
FIG. 6A is a top view of a protective layer in accordance with some other embodiments of the present disclosure.
Figure 6B:
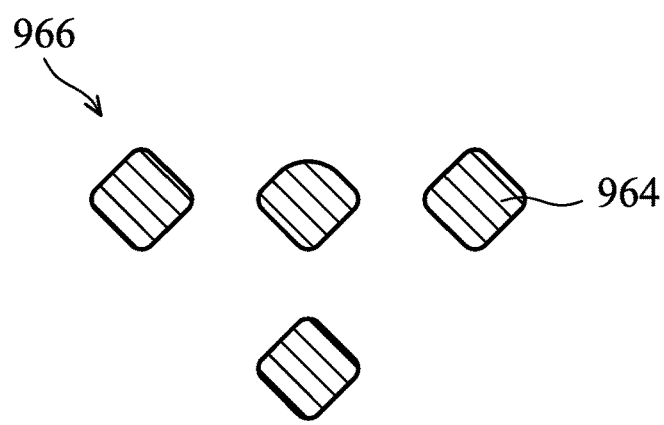
FIG. 6B is a top view of vias in accordance with some other embodiments of the present disclosure.

FIG. 6A is a top view of a protective layer 936 in accordance with some other embodiments of the present disclosure. FIG. 6B is a top view of a via array 966 including two or more conductive vias 964 formed in a manufacturing process using the protective layer 936 shown in FIG. 6A. As shown in FIG. 6B, the via array 966 includes four conductive vias 964, and the conductive vias 964 have a square top view or an irregular shape top view, in accordance with some embodiments. As shown in FIG. 6A, when viewed from a top view, the protective layer 936 is positioned along the periphery of the conductive vias 964, in accordance with some embodiments. As shown in FIG. 6A, when viewed from a top view, the protective layer 936 has a shape that encloses the conductive vias 964, in accordance with some embodiments. In some embodiments of the present disclosure, the via array 966 is positioned in the pad via area of the semiconductor device structure.

Figure 7A:
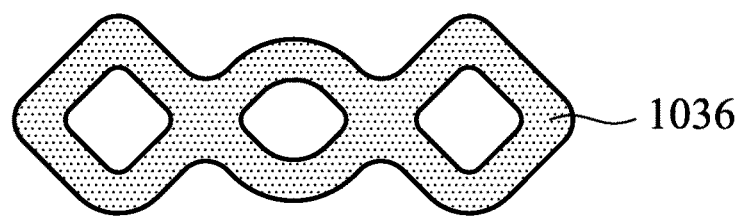
FIG. 7A is a top view of a protective layer in accordance with some other embodiments of the present disclosure.
Figure 7B:
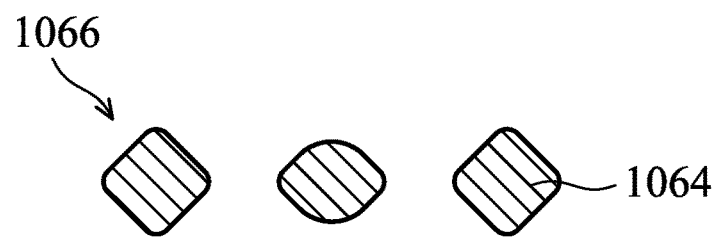
FIG. 7B is a top view of vias in accordance with some other embodiments of the present disclosure.

FIG. 7A is a top view of a protective layer 1036 in accordance with some other embodiments of the present disclosure. FIG. 7B is a top view of a via array 1066 including two or more conductive vias 1064 formed in a manufacturing process using the protective layer 1036 shown in FIG. 7A. As shown in FIG. 7B, the via array 1066 includes three conductive vias 1064, and the conductive vias 1064 have a square top view or an irregular shape top view, in accordance with some embodiments. As shown in FIG. 7B, the three conductive vias 1064 are arranged in a straight line, in accordance with some embodiments. As shown in FIG. 7A, when viewed from a top view, the protective layer 1036 is positioned along the periphery of the conductive vias 1064, in accordance with some embodiments. As shown in FIG. 7A, when viewed from a top view, the protective layer 1036 has a shape that encloses the conductive vias 1064, in accordance with some embodiments. In some embodiments of the present disclosure, the via array 1066 is positioned in the pad via area of the semiconductor device structure.

Figure 8A:
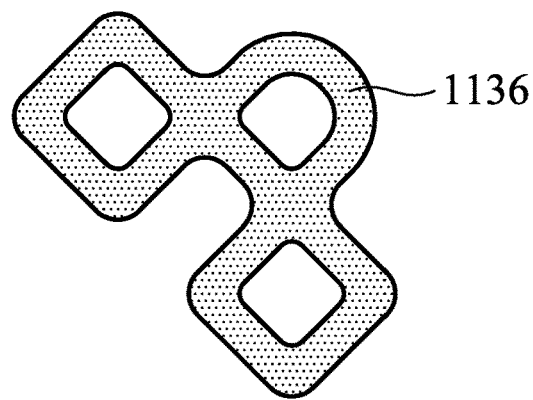
FIG. 8A is a top view of a protective layer in accordance with some other embodiments of the present disclosure.
Figure 8B:
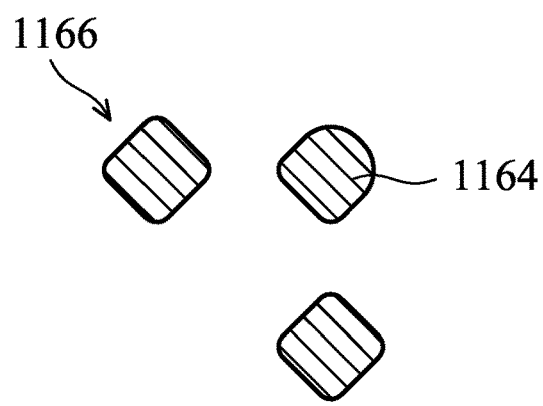
FIG. 8B is a top view of vias in accordance with some other embodiments of the present disclosure.

FIG. 8A is a top view of a protective layer 1136 in accordance with some other embodiments of the present disclosure. FIG. 8B is a top view of a via array 1166 including two or more conductive vias 1164 formed in a manufacturing process using the protective layer 1136 shown in FIG. 8A. As shown in FIG. 8B, the via array 1166 includes three conductive vias 1164, and the conductive vias 1164 have a square top view or an irregular shape top view, in accordance with some embodiments. As shown in FIG. 8B, the three conductive vias 1164 are not arranged in a straight line, in accordance with some embodiments. As shown in FIG. 8A, when viewed from a top view, the protective layer 1136 is positioned along the periphery of the conductive vias 1164, in accordance with some embodiments. As shown in FIG. 8A, when viewed from a top view, the protective layer 1136 has a shape that encloses the conductive vias 1164, in accordance with some embodiments. In some embodiments of the present disclosure, the via array 1166 is positioned in the pad via area of the semiconductor device structure.

Embodiments of the disclosure use a protective layer to protect the first isolation feature. Therefore, the first isolation feature may be removed slowly during the etching process which etches the bottom layer. Therefore, in some embodiments, the second isolation feature remains over the third isolation feature after the etching process which etches the bottom layer. In some embodiments, the remaining second isolation feature protects the third isolation feature in the subsequent processes. Due to the protection of the second isolation feature, the third isolation feature of the bottom layer may remain over the material layer after the etching process which etches the material layer, in accordance with some embodiments. Therefore, the etched material layer and the subsequently formed conductive vias in the material layer may preserve the designed pattern.

In accordance with some embodiments, a method for forming a semiconductor device structure is provided. The method includes forming a bottom layer over a substrate, forming a middle layer over the bottom layer, forming an upper layer over the middle layer, developing the upper layer to form an upper pattern with a first opening exposing the middle layer and a sidewall of the upper pattern. The upper pattern has a top surface. The method further includes conformally forming a protective layer over the upper pattern and the exposed middle layer, anisotropically etching the protective layer to leave a portion of the protective layer over the sidewall of the upper pattern and expose the middle layer, etching the middle layer not covered by the upper pattern and the portion of the protective layer to form a middle pattern with a second opening exposing the bottom layer, and etching the bottom layer though the second opening of the middle pattern.

In accordance with some embodiments, a method for forming a semiconductor device structure is provided. The method includes forming a material layer over a substrate, forming a bottom layer over the material layer, forming a middle layer over the bottom layer, forming an upper layer over the middle layer, developing the upper layer to form an upper pattern. The upper pattern includes two first openings exposing the middle layer, and a first isolation feature between the two first openings. The method also includes forming a protective layer conformally covering the first isolation feature and the middle layer, anisotropically etching the protective layer to expose the middle layer, and etching the exposed middle layer to form a middle pattern with two second openings exposing the bottom layer. The two second openings are aligned with the two first openings. The middle pattern includes a second isolation feature between the two second openings and aligned with the first isolation feature.

In accordance with some embodiments, a method for forming a semiconductor device structure is provided. The method includes forming an etch stop layer over a substrate, forming an oxide layer over the etch stop layer, forming a dielectric layer over the oxide layer, forming an anti-reflective coating layer over the dielectric layer, forming a tri-layer resist layer over the anti-reflective coating layer. The tri-layer resist layer includes a bottom layer over the anti-reflective coating layer, a middle layer over the bottom layer, and a patterned upper layer over the middle layer. The patterned upper layer has a first opening which exposes the middle layer. The method also includes forming a protective layer conformally covering the tri-layer resist layer. A portion of the protective layer is in the first opening and covers the middle layer. The method further includes etching the portion of the protective layer covering the middle layer to expose the middle layer, etching the exposed middle layer to form a middle pattern with a second opening exposing the bottom layer, and etching the bottom layer though the second opening of the middle pattern to form a bottom pattern with a third opening exposing the anti-reflective coating layer. The method further includes sequentially etching the anti-reflective coating layer, the dielectric layer, and the oxide layer to form a fourth opening by using the bottom pattern as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a bottom layer over a substrate;
   forming a middle layer over the bottom layer;
   forming an upper layer over the middle layer;
   patterning the upper layer to form an upper pattern with a first opening exposing the middle layer;
   conformally forming a protective layer over the upper pattern and the exposed middle layer;
   anisotropically etching the protective layer to leave a portion of the protective layer over a sidewall of the upper pattern to expose the middle layer;
   etching the middle layer not covered by the upper pattern and the portion of the protective layer to form a middle pattern with a second opening exposing the bottom layer; and
   etching the bottom layer though the second opening of the middle pattern while removing the upper pattern and the portion of the protective layer over the sidewall of the upper pattern.

2. The method as claimed in claim 1, wherein after anisotropically etching the protective layer, a top surface of the upper pattern is exposed.

3. The method as claimed in claim 1, wherein the protective layer is made of polymer material, dielectric material, or a combination thereof.

4. The method as claimed in claim 1, wherein the anisotropic etching of the protective layer and the etching of the middle layer not covered by the upper pattern and the portion of the protective layer are performed by a single etching process.

5. The method as claimed in claim 1, further comprising:
   before forming the bottom layer, forming a material layer over the substrate, wherein after the bottom layer is formed, the material layer is between the bottom layer and the substrate,
   wherein the etching process, which etches the bottom layer though the second opening of the middle pattern, forms a bottom pattern with a third opening, wherein the third opening exposes the material layer.

6. The method as claimed in claim 5, wherein after forming the third opening exposing the material layer, the method further comprises:
   etching the material layer through the third opening of the bottom pattern to form a fourth opening in the material layer.

7. The method as claimed in claim 6, further comprising:
   filling the fourth opening with a metal material to form a conductive via in the material layer.

8. The method as claimed in claim 7, wherein the conductive via is in direct contact with the substrate.

9. The method as claimed in claim 5, wherein the material layer comprises an interlayer dielectric (ILD) layer.

10. The method as claimed in claim 5, further comprising:
    before forming the bottom layer, forming a material layer over the substrate, wherein after the bottom layer is formed, the material layer is between the bottom layer and the substrate; and
    forming a plurality of mask elements over the material layer, wherein the bottom layer covers the plurality of mask elements.

11. A method for forming a semiconductor device structure, comprising:
    forming a material layer over a substrate;
    forming a bottom layer over the material layer;
    forming a middle layer over the bottom layer;
    forming an upper layer over the middle layer;
    developing the upper layer to form an upper pattern, wherein the upper pattern comprises:
    two first openings exposing the middle layer; and
    a first isolation feature between the two first openings;
    forming a protective layer conformally covering the first isolation feature and the middle layer;
    anisotropically etching the protective layer to expose the middle layer; and
    etching the exposed middle layer to form a middle pattern with two second openings exposing the bottom layer, wherein the two second openings are aligned with the two first openings, wherein the middle pattern comprises a second isolation feature between the two second openings and aligned with the first isolation feature.

12. The method as claimed in claim 11, further comprising:
    etching the bottom layer through the two second openings of the middle pattern to form a bottom pattern with two third openings exposing the material layer, wherein the two third openings are aligned with the two second openings, wherein the bottom pattern comprises a third isolation feature between the two third openings and aligned with the second isolation feature.

13. The method as claimed in claim 12, wherein during the etching process which etches the bottom layer through the two second openings of the middle pattern, the upper pattern and the protective layer are removed.

14. The method as claimed in claim 12, wherein after forming the two third openings which expose the material layer, the method further comprises:
    etching the material layer through the two third openings of the bottom pattern to form two fourth openings in the material layer and aligned with the two third openings, wherein the etched material layer comprises a fourth isolation feature between the two fourth openings and aligned with the third isolation feature.

15. The method as claimed in claim 14, wherein after the etching process which etches the material layer through the two third openings of the bottom pattern, the third isolation feature of the bottom pattern remains over the fourth isolation feature of the material layer.

16. The method as claimed in claim 14, further comprising:
    filling the two fourth openings with a metal material to form two conductive vias in the material layer.

17. A method for forming a semiconductor device structure, comprising:
    forming an etch stop layer over a substrate;
    forming an oxide layer over the etch stop layer;
    forming a dielectric layer over the oxide layer;
    forming an anti-reflective coating layer over the dielectric layer;
    forming a tri-layer resist layer over the anti-reflective coating layer, wherein the tri-layer resist layer comprises:
    a bottom layer over the anti-reflective coating layer;
    a middle layer over the bottom layer; and a patterned upper layer over the middle layer, wherein the patterned upper layer has a first opening which exposes the middle layer;

forming a protective layer conformally covering the tri-layer resist layer, wherein a portion of the protective layer is in the first opening and covers the middle layer;

etching the portion of the protective layer covering the middle layer to expose the middle layer;

etching the exposed middle layer to form a middle pattern with a second opening exposing the bottom layer;

etching the bottom layer though the second opening of the middle pattern to form a bottom pattern with a third opening exposing the anti-reflective coating layer; and sequentially etching the anti-reflective coating layer, the dielectric layer, and the oxide layer to form a fourth opening by using the bottom pattern as an etch mask.

18. The method as claimed in claim 17, wherein the protective layer is made of polymer material, dielectric material, or a combination thereof.

19. The method as claimed in claim 18, wherein the polymer material is formed by applying a precursor gas to the tri-layer resist layer, wherein the precursor gas comprises $C_xH_yF_z$, wherein x is an integer in a range from 1 to 30, y is an integer in a range from 0 to 62, z is an integer in a range from 0 to 62.

20. The method as claimed in claim 17, further comprising:
    filling the fourth opening with a metal material to form a conductive via in the material layer, wherein the conductive via has a circular top view, a drop-shaped top view, a rhombus top view or a square top view.

* * * * *